US010727666B2

(12) United States Patent
Ha et al.

(10) Patent No.: US 10,727,666 B2
(45) Date of Patent: Jul. 28, 2020

(54) RELATING TO DIRECT CURRENT PROTECTION SCHEMES

(71) Applicant: General Electric Technology GmbH, Baden (CH)

(72) Inventors: Hengxu Ha, Stafford (GB); Sankara Subramanian Sri Gopala Krishna Murthi, Stafford (GB)

(73) Assignee: General Electric Technology GmbH, Baden (CH)

( * ) Notice: Subject to any disclaimer, the term of this patent is extended or adjusted under 35 U.S.C. 154(b) by 277 days.

(21) Appl. No.: 15/574,024

(22) PCT Filed: May 12, 2016

(86) PCT No.: PCT/EP2016/060670
§ 371 (c)(1),
(2) Date: Nov. 14, 2017

(87) PCT Pub. No.: WO2016/180921
PCT Pub. Date: Nov. 17, 2016

(65) Prior Publication Data
US 2018/0301894 A1    Oct. 18, 2018

(30) Foreign Application Priority Data
May 14, 2015   (EP) .................................... 15275137

(51) Int. Cl.
*H02H 7/26*     (2006.01)
*G01R 31/08*    (2020.01)
(Continued)

(52) U.S. Cl.
CPC ........... *H02H 7/265* (2013.01); *G01R 31/085* (2013.01); *H02H 1/0007* (2013.01);
(Continued)

(58) Field of Classification Search
USPC ....................................... 361/62–69
See application file for complete search history.

(56) References Cited

U.S. PATENT DOCUMENTS 4,091,433 A * 5/1978 Wilkinson ............. H02H 3/387
361/76
4,922,368 A * 5/1990 Johns ................... H02H 1/0015
361/62
(Continued)

FOREIGN PATENT DOCUMENTS

CN      103986132 A    8/2014
WO      2015/043644 A1  4/2015

OTHER PUBLICATIONS

Machine Translation and First Office Action and Search issued in connection with corresponding CN Application No. 201680027988.8 dated Sep. 10, 2018.
(Continued)

*Primary Examiner* — Danny Nguyen
(74) *Attorney, Agent, or Firm* — Eversheds Sutherland (US) LLP

(57) ABSTRACT

A DC protection scheme for protecting a DC power transmission medium within a DC electrical power network. The scheme includes a protection device coupled to a DC power transmission medium, being operable to protect the power transmission medium from a fault; an apparatus to measure at least one electrical property of the power transmission medium; and a controller programmed to determine the direction of the electrical fault; determine whether the electrical fault is an internal or external fault; and operate the protection device to protect the DC power transmission medium if the determination of the direction of the electrical fault and/or the determination of whether the electrical fault is an internal or external fault meet a predefined criterion.

15 Claims, 2 Drawing Sheets

(51) Int. Cl.
*H02H 1/00* (2006.01)
*G01R 23/167* (2006.01)
*G01R 31/11* (2006.01)
*H02H 3/28* (2006.01)
*H02H 3/44* (2006.01)

(52) U.S. Cl.
CPC ............ *H02H 7/268* (2013.01); *G01R 23/167* (2013.01); *G01R 31/08* (2013.01); *G01R 31/11* (2013.01); *H02H 3/28* (2013.01); *H02H 3/44* (2013.01); *H02H 7/263* (2013.01)

(56) References Cited

U.S. PATENT DOCUMENTS

| | | |
|---|---|---|
| 2013/0015878 A1 | 1/2013 | Perera et al. |
| 2014/0300370 A1 | 10/2014 | Paolone et al. |
| 2016/0077149 A1* | 3/2016 | Schweitzer, III .. G01R 31/2836 307/131 |

OTHER PUBLICATIONS

Extended European Search Report and Opinion issued in connection with corresponding EP Application No. 15275137.6 dated Oct. 21, 2015.

International Search Report and Written Opinion issued in connection with corresponding PCT Application No. PCT/EP2016/060670 dated Aug. 8, 2016.

International Preliminary Report on Patentability issued in connection with corresponding PCT Application No. PCT/EP2016/060670 dated Nov. 14, 2017.

\* cited by examiner

RELATING TO DIRECT CURRENT PROTECTION SCHEMES

FIELD OF INVENTION

Embodiments of the invention relate to a direct current (DC) protection scheme and a DC electrical power network including a plurality of such schemes.

BACKGROUND OF THE INVENTION

DC electrical power networks, such as DC grids, typically include a plurality of terminals each of which may be operatively associated with a power converter to interconnect the DC power transmission network with a respective alternating current (AC) network.

Respective pairs of terminals are interconnected by a section of DC power transmission medium, such as a transmission line or cable. Protection devices, such as circuit breakers and relays, are operated in the event of a fault to protect the DC electrical power network.

SUMMARY OF INVENTION

According to a first aspect of embodiments of the invention, there is provided a DC protection scheme for protecting a DC power transmission medium within a DC electrical power network, the DC protection scheme comprising: a protection device coupled in use to a DC power transmission medium, the protection device being operable to protect the DC power transmission medium from an electrical fault; a measurement apparatus to selectively measure at least one electrical property of the DC power transmission medium; and a controller programmed to: determine the direction of the electrical fault by comparing the forward and backward travelling waves derived from the or each measured electrical property, e.g. voltage or current; determine whether the electrical fault is an internal or external fault by comparing the first and second frequency components derived from the or each measured electrical property, wherein the frequency of the first frequency component is higher than the frequency of the second frequency component; and operate the protection device to protect the DC power transmission medium if the determination of the direction of the electrical fault and/or the determination of whether the electrical fault is an internal or external fault meet a predefined criterion.

The DC protection scheme of embodiments of the invention permits the detection of a fault and subsequent operation of a protection device, i.e. by way of a comparison between suitable values to identify the direction and/or type of the electrical fault, in a manner which requires only a measured electrical property of a DC power transmission medium to be acquired.

Such measurement(s) can be obtained locally, i.e. immediately adjacent to the controller and protection device associated with the DC power transmission medium, and so embodiments of the invention are able to protect the DC power transmission medium without the need to establish a communication link with one or more remote elements that would otherwise be required to provide an indication of a fault occurring a long distance away from the said controller and protection device.

The aforementioned functionality is especially desirable when the considerable length of a DC power transmission medium, e.g. several hundred kilometres, means that communication with one or more remote elements is unreliable, or the resulting delay in receiving information once communication is established is such that an associated protection device cannot be operated quickly enough to provide meaningful protection.

Moreover, the reliance solely on local voltage and current measurements permits the protection scheme of embodiments of the invention to operate the protection device extremely quickly, e.g. within 0.5 millisecond of a fault occurring.

The provision of the above controller in the DC protection scheme of embodiments of the invention therefore results in a non-unit DC protection scheme with absolute selectivity and rapid response times.

In an embodiment, the controller is programmed to derive each travelling wave from the or each measured electrical property by combining the or each measured electrical property with the surge impedance or admittance of the DC power transmission medium.

The above features of the controller permits derivation of the travelling waves without the need for communication with remote elements, which could result in an undesirable delay in operating the protection device.

In embodiments, the controller may be programmed to derive each travelling wave from the or each measured electrical property by: converting the or each measured electrical property to positive and zero sequence components; and combining the positive and zero sequence components with the positive and zero sequence surge impedances or admittances of the DC power transmission medium respectively. This enables decoupling of the mutual inductance and admittance of two conductors of a bi-polar DC power transmission medium.

The direction of the electrical fault, i.e. forward or reverse, may be determined as follows.

In embodiments of the invention, the controller may be programmed to obtain travelling wave norm values of the forward and backward travelling waves derived from the or each measured electrical property. The controller may be programmed to perform a comparison between the obtained travelling wave norm values of the forward and backward travelling waves to determine the direction of the electrical fault. The comparison between the obtained travelling wave norm values of the forward and backward travelling waves may be performed within a duration that is twice the time it takes for each travelling wave to propagate from one end of the DC power transmission medium to the other end of the DC power transmission medium.

The foregoing configuration of the controller provides a reliable means for using local measurements to identify the direction of the electrical fault.

In further embodiments of the invention, the controller may be programmed to modify each travelling wave to remove a pre-fault component. The controller may be programmed to obtain the travelling wave norm values from the modified forward and backward travelling waves. This improves the accuracy of the comparison between the obtained travelling wave norm values to identify the direction of the electrical fault.

The determination of the direction of the electrical fault may meet the predefined criterion when: the ratio of the travelling wave norm value of the forward travelling wave to the travelling wave norm value of the backward travelling wave exceeds a predefined threshold that indicates the presence of a forward directional fault; and/or either of the travelling wave norm values exceeds a predefined threshold that indicates the presence of a fault.

The controller programmed in this manner improves the ability of the DC protection scheme of embodiments of the invention to carry out its protective function.

The forward and backward travelling waves may be travelling voltage waves or travelling current waves.

In embodiments of the invention, the controller may be programmed to obtain frequency component norm values of the first and second frequency components derived from the or each measured electrical property, and the controller may be programmed to perform a comparison between the obtained frequency component norm values to determine whether the electrical fault is an internal or external fault.

The foregoing configuration of the controller provides a reliable means for using local measurements to identify the type of electrical fault.

In further embodiments of the invention, the determination of whether the electrical fault is an internal or external fault may meet the predefined criterion when the ratio of the frequency component norm value of the first frequency component to the frequency component norm value of the second frequency component exceeds a predefined threshold that indicates the presence of an internal fault.

The controller programmed in this manner improves the ability of the DC protection scheme of embodiments of the invention to carry out its protective function.

Each frequency component may be, but is not limited to: a frequency component of the or each measured electrical property; a frequency component of a sequence component converted from the or each measured property; a frequency component of a forward or backward travelling wave derived from the or each measured electrical property; or a frequency component of a positive or zero sequence forward or backward travelling wave derived from the or each measured electrical property.

Each norm value may be a root mean square value, an absolute mean value or another order norm value.

In an embodiment of the invention, the determination of the direction of the electrical fault and the determination of whether the electrical fault is an internal or external fault meet the predefined criterion when the electrical fault is identified as a forward directional fault and/or an internal fault. Programming the controller in this manner beneficially enhances the absolute selectivity of the DC protection scheme of embodiments of the invention.

In still further embodiments of the invention, the controller may be additionally programmed to operate the protection device to protect the DC power transmission medium upon receipt of an external signal indicating the presence of an internal fault.

Such a configuration extends the functionality of the DC protection scheme of embodiments of the invention in circumstances where modest communication between, e.g. remote terminals in a DC electrical power network, is possible.

According to a second aspect of the invention, there is provided a DC electrical power network comprising a plurality of DC protection schemes as described hereinabove.

Such a DC electrical power network shares the benefits associated with the DC protection schemes included therein.

BRIEF DESCRIPTION OF THE DRAWINGS

An embodiment of the invention will now be described, by way of a non-limiting example, with reference to the accompanying drawings in which.

DETAILED DESCRIPTION

Figure 1:
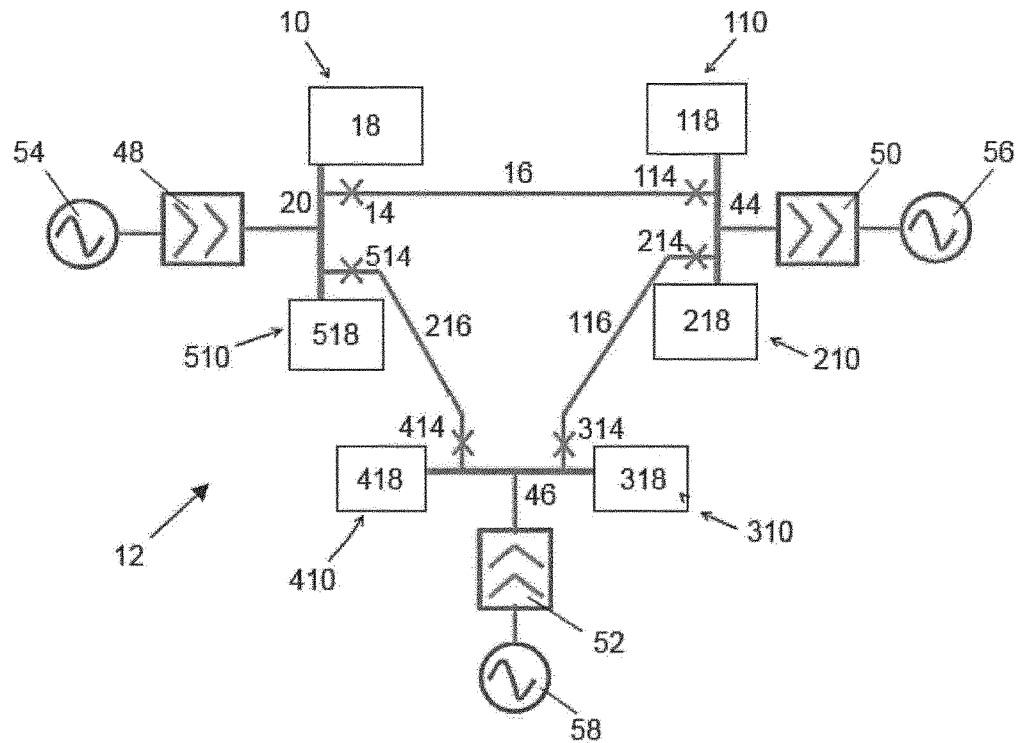
FIG. 1 shows a schematic view of a DC electrical power network including a plurality of DC protection schemes according to respective embodiments of the invention.

A DC protection scheme according to a first embodiment of the invention is designated generally by reference numeral 10 and forms part of a DC electrical power network 12 in the form of a DC grid, as shown schematically in FIG. 1.

The first DC protection scheme 10 includes a first protection device 14 which, in the embodiment shown is a circuit breaker, although other types of protection devices such as a relay are also possible. The first protection device 14, i.e. circuit breaker, is electrically coupled in use to a DC power transmission medium 16, i.e. arranged in-line with the DC power transmission medium 16, and is operable to protect the DC power transmission medium 16 from an electrical fault, i.e. tripping the circuit breaker to clear the electrical fault inside the DC power transmission medium 16.

The DC protection scheme 10 also includes a first measurement apparatus (not shown) which is able to selectively measure the voltages and currents of the DC power transmission medium 16.

Figure 2:
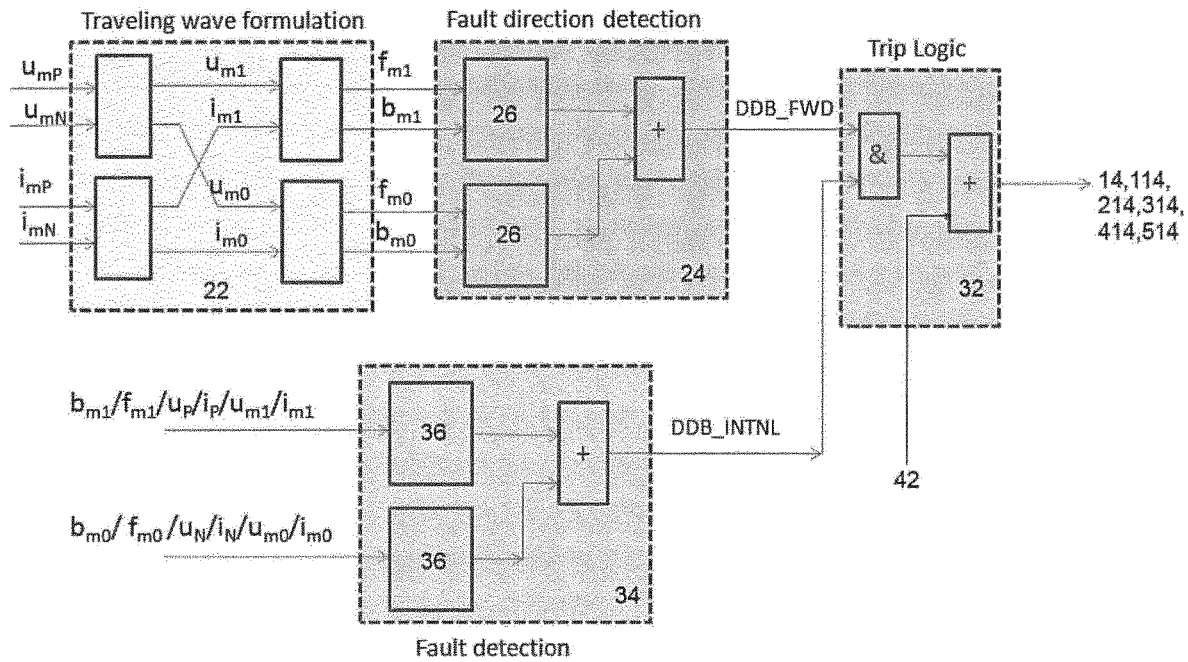
FIG. 2 shows a schematic representation of a controller forming a part of each of the DC protection schemes shown in FIG. 1.

In addition, the DC protection scheme 10 includes a first controller 18, as shown in FIG. 2, that is programmed to: determine the direction of an electrical fault by comparing forward and backward travelling wavesderived from the measured voltages and currents; determine whether the electrical fault is an internal or external fault by comparing first and second frequency components derived from the measured voltages and currents wherein the frequency of the first frequency component is higher than the frequency of the second frequency component; and operate the first protection device 14 to protect the DC power transmission medium 16 if the determination of the direction of the electrical fault and the determination of whether the electrical fault is an internal or external fault meet a predefined criterion.

In the embodiment shown, the first controller 18 is programmed such that the determination of the direction of the electrical fault and the determination of whether the electrical fault is an internal or external fault meet a predefined criterion when the electrical fault is identified as a forward directional fault and an internal fault.

Each of the first protection device 14, the first measurement apparatus and the first controller 18 is operatively associated with a first terminal 20 of the DC electrical power network 12.

In the embodiment shown, the DC power transmission medium 16 is defined by a first transmission line, and more particularly by a first bi-polar transmission line, i.e. a transmission line incorporating two conductors (not shown) operating at different polarities. In other embodiments (not shown) the DC power transmission medium 16 may instead be defined by a first transmission cable which may or may not be bi-polar and could be mono-polar, i.e. could incorporate a single conductor operating at a single polarity. The DC power transmission medium 16 could also be defined by a mono-polar transmission line. When the DC power transmission medium 16 is defined by a mono-polar transmission cable or line, the first measurement apparatus is configured to selectively measure the voltage and current of the DC power transmission medium 16.

Since the DC power transmission medium 16 is defined by a bi-polar transmission line, measured samples of positive voltage $u_{mP}$ and positive current $i_{mP}$ of the positive polar conductor and measured samples of negative voltage $u_{mN}$ and negative current $i_{mN}$ of the negative polar conductor can be obtained. Moreover, the sampling period Ts may, for example, be given by:

$$Ts = 1/96000 \text{ seconds}$$

To decouple the mutual inductance and admittance of the two conductors of the DC power transmission medium 16, the measured voltages $u_{mP}$, $u_{mN}$ are then converted to positive and zero sequence voltage components $u_{m1}$, $u_{m0}$, while the measured currents $i_{mP}$, $i_{mN}$ are converted to positive and zero sequence current components $i_{m1}$, $i_{m0}$, as follows:

$$\begin{cases} u_{m1} = u_{mP} - u_{mN} & i_{m1} = i_{mP} - i_{mN} \\ u_{m0} = u_{mP} + u_{mN} & i_{m0} = i_{mP} + i_{mN} \end{cases}$$

As indicated by reference numeral 22 in FIG. 2, the first controller 18 is programmed to derive forward and backward travelling voltage and current waves $f_{m1}$, $f_{m0}$, $b_{m1}$, $b_{m0}$ by combining the positive and zero sequence components $u_{m1}$, $u_{m0}$, $i_{m1}$, $i_{m0}$ of the measured voltages and currents $u_{mP}$, $u_{mN}$, $i_{mP}$, $i_{mN}$ with the positive and zero sequence surge impedances $z_{c1}$, $z_{c0}$ and admittances $y_{c1}$, $y_{c1}$ of the DC power transmission medium 16 respectively, as follows:

$$\begin{cases} f_{m1}(t) = u_{m1}(t) + z_{c1} * i_{m1}(t) \\ b_{m1}(t) = u_{m1}(t) - z_{c1} * i_{m1}(t) \end{cases} \begin{pmatrix} \text{positive sequence travelling} \\ \text{voltage waves} \end{pmatrix}$$

$$\begin{cases} f_{m0}(t) = u_{m0}(t) + z_{c0} * i_{m0}(t) \\ b_{m0}(t) = u_{m0}(t) - z_{c0} * i_{m0}(t) \end{cases} \begin{pmatrix} \text{zero sequence travelling} \\ \text{voltage waves} \end{pmatrix}$$

$$\begin{cases} f_{m1}(t) = i_{m1}(t) + y_{c1} * u_{m1}(t) \\ b_{m1}(t) = i_{m1}(t) - y_{c1} * u_{m1}(t) \end{cases} \begin{pmatrix} \text{positive sequence travelling} \\ \text{current waves} \end{pmatrix}$$

$$\begin{cases} f_{m0}(t) = i_{m0}(t) + y_{c0} * u_{m0}(t) \\ b_{m0}(t) = i_{m0}(t) - y_{c0} * u_{m0}(t) \end{cases} \begin{pmatrix} \text{zero sequence travelling} \\ \text{current waves} \end{pmatrix}$$

Where $f_{m1}$ is the positive sequence forward traveling voltage or current wave; $b_{m1}$ is the positive sequence backward traveling voltage or current wave; $f_{m0}$ is the zero sequence forward traveling voltage or current wave; $b_{m0}$ is the zero sequence backward traveling voltage or current wave;

$z_{c1} = L^{-1}[\sqrt{(R_1+sL_1)/sC_1}]$ is the positive-sequence surge impedance in time domain;

$z_{c0} = L^{-1}[\sqrt{(R_0+sL_1)/sC_0}]$ is the zero-sequence surge impedance in time domain;

$y_{c1} = L^{-1}[\sqrt{sC_1/(R_1+sL_1)}]$ is the positive-sequence surge admittance in time domain;

$y_{c0} = L^{-1}[\sqrt{sC_0/(R_0+sL_0)}]$ is the zero-sequence surge admittance in time domain, in which $R_1$ and $R_1$ are respectively the positive-sequence and zero-sequence resistances per length of DC power transmission medium 16; $L_1$ and $L_0$ are respectively the positive-sequence and zero-sequence inductances per length of DC power transmission medium 16; $C_1$ and $C_0$ are respectively the positive-sequence and zero-sequence capacitances per length of DC power transmission medium 16.

It will be understood that the symbol * in the above equations is intended to mean a convolution operation.

In other embodiments of the invention in which the DC power transmission medium 16 is mono-polar instead of bi-polar, it would not be necessary to use the positive and zero sequence components $u_{m1}$, $u_{m0}$, $i_{m1}$, $i_{m0}$ of the measured voltages and currents $u_{mP}$, $u_{mN}$, $i_{mP}$, $i_{mN}$ to derive the travelling voltage and current waves $f_{m1}$, $f_{m0}$, $b_{m1}$, $b_{m0}$. In such embodiments the travelling voltage and current waves $f_{m1}$, $f_{m0}$, $b_{m1}$, $b_{m0}$ can instead be derived by combining the measured voltage and currents $u_{mP}$, $u_{mN}$, $i_{mP}$, $i_{mN}$ with the surge impedances $z_{c1}$, $z_{c0}$ and admittances $y_{c1}$, $y_{c1}$ of the DC power transmission medium 16 respectively.

It will be understood that it is not essential to derive both travelling voltage and current waves $f_{m1}$, $f_{m0}$, $b_{m1}$, $b_{m0}$, and the controller may instead be programmed to derive either the travelling voltage waves or the travelling current waves.

A fault direction detection unit 24 of the first controller 18 includes two fault direction detection sub-units 26, each of which is configured to identify the direction of the electrical fault. Optionally the fault direction detection sub-units 26 may be replaced by a single fault direction detection sub-unit 26, particularly if the DC power transmission medium 16 is mono-polar instead of bi-polar.

A first of the fault direction detection sub-units 26 receives the positive sequence forward and backward travelling waves $f_{m1}$, $b_{m1}$, while a second of the fault direction detection sub-units 26 receives the zero sequence forward and backward travelling waves $f_{m0}$, $b_{m0}$.

Figure 3:
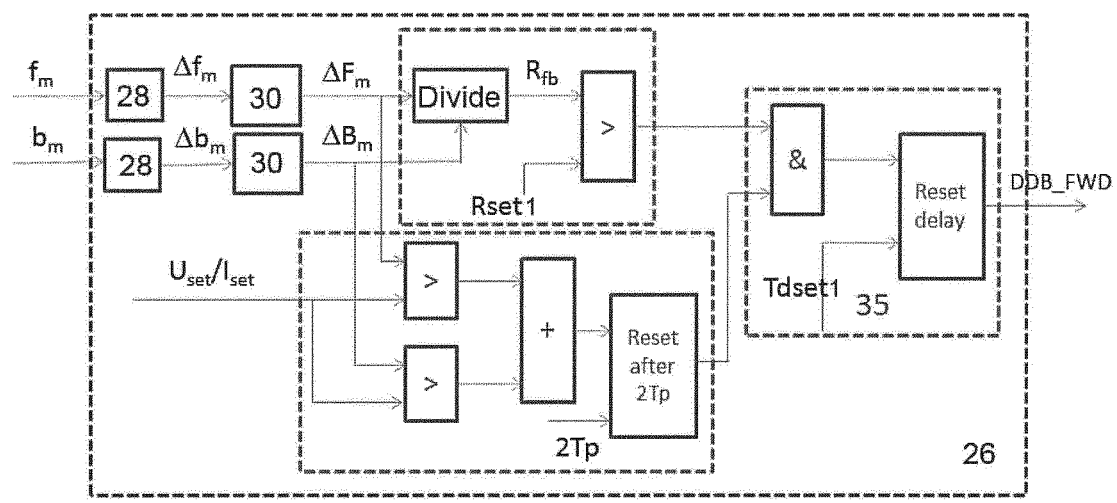
FIG. 3 shows a schematic representation of a fault direction detection sub-unit 26 that forms a part of the controller shown in FIG. 2.

As shown by reference numeral 28 in FIG. 3, each fault direction detection sub-unit 26 modifies each travelling wave (indicated as $f_m$ and $b_m$ for brevity) to remove a pre-fault component from the travelling wave $f_m$, $b_m$ by, for example, applying the high pass filter or delta technique or wavelet transform or wavelet filter banks or differential operation on the forward and backward travelling waves.

As an example, the delta technique is employed here for removing the pre-fault component from each travelling wave $f_m$, $b_m$:

$$y(n) = x(n) - x(n-W)$$

where x is the input signal which is the travelling wave $f_m$, $b_m$; y is output signal which is the modified travelling wave $\Delta f_m$, $\Delta b_m$; W being the time window length, e.g. if the time window is 0.5 millisecond and the sampling period Ts is, as set out above, 1/96000, then the time window length is given by $$W = 0.0005/(1/96000) = 48$$

As shown by reference numeral 30 in FIG. 3, each fault direction detection sub-unit 26 then obtains travelling wave norm values $\Delta F_m$, $\Delta B_m$ from the modified travelling waves $\Delta f_m$, $\Delta b_m$. Each travelling wave norm value $\Delta F_m$, $\Delta B_m$ be a root mean square (RMS) value, an absolute mean value or another order norm value.

As an example, the RMS value $\Delta F_m$, $\Delta B_m$ can be obtained from a given modified travelling wave $\Delta f_m$, $\Delta b_m$, as follows:

$$y(n) = \sqrt{\frac{1}{W}\sum_{k=n-W+1}^{n}|x(k)|^2}$$

where x is the input signal which is the given modified travelling wave $\Delta f_m$, $\Delta b_m$; y is the output signal which is the obtained RMS value $\Delta F_m$, $\Delta B_m$;

W is again the time window length.

Subsequently each fault direction detection sub-unit 26 performs a comparison between the obtained travelling wave norm values $\Delta F_m$, $\Delta B_m$ to determine whether two conditions are satisfied.

In the first condition, if the ratio Rfb of the travelling wave norm value $\Delta F_m$ of the forward travelling wave $f_m$ to the travelling wave norm value $\Delta B_m$ of the backward travelling wave $b_m$ exceeds a predefined threshold Rset1, this indicates the presence of a forward directional fault. Rset1 has a range [0,1] and may be set at, for example, 0.1.

In the second condition, if either of the obtained travelling wave norm values $\Delta F_m$, $\Delta B_m$ exceeds a predefined threshold (which is Uset for the travelling voltage wave norm values and Iset for the travelling current wave norm values), this indicates the presence of a fault. Uset may be set at, for example, 0.1 per sub-unit, and Iset may be set at, for example, 0.05 per sub-unit.

The comparison between the obtained travelling wave norm values $\Delta F_m$, $\Delta B_m$ is performed within a duration that is twice the time $T_p$ it takes for each travelling wave $f_m$, $b_m$ to propagate from one end of the DC power transmission medium 16 to the other end of the DC power transmission medium 16. The duration $T_p$ is calculated by multiplying the length of the DC power transmission medium 16 by the velocity of a given travelling wave $f_m$, $b_m$. This comparison is reset after the duration $T_p$ has lapsed.

If both the first and second conditions are satisfied, the corresponding fault direction detection sub-unit 26 provides a first output indication DDB_FWD that indicates the presence of a forward directional fault. Each fault direction detection sub-unit 26 has a reset delay of Tdset1 that is normally set at 1 millisecond. If at least one of the first and second conditions are not satisfied, the corresponding fault direction detection sub-unit 26 identifies the electrical fault as a reverse directional fault.

The fault direction detection unit 24 identifies the electrical fault as a forward directional fault if either or both of the fault direction detection sub-units 26 provides the first output indication DDB_FWD, and thereby provides the first output indication DDB_FWD to a trip logic block 32 of the first controller 18.

In this manner the first controller 18 is programmed to obtain travelling wave norm values $\Delta F_m$, $\Delta B_m$ of forward and backward travelling waves $f_m$, $b_m$ derived from the measured voltages and currents $u_{mP}$, $u_{mN}$, $i_{mP}$, $i_{mN}$, and then perform a comparison between the obtained travelling wave norm values $\Delta F_m$, $\Delta B_m$ to identify the direction of the electrical fault.

An internal fault detection unit 34 of the first controller 16 includes two internal fault detection sub-units 36, each of which is configured to identify the type of electrical fault. Optionally the internal fault detection sub-units 36 may be replaced by a single internal fault detection sub-unit 36, particularly if the DC power transmission medium 16 is mono-polar instead of bi-polar.

Figure 4:
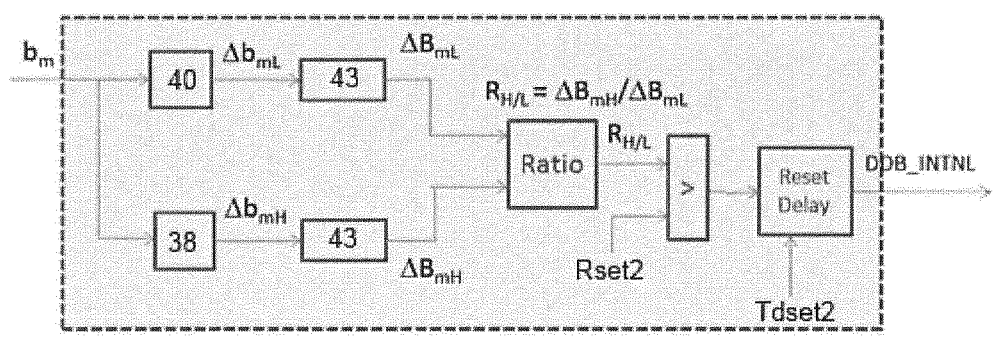
FIG. 4 shows a schematic representation of an internal fault detection sub-unit that forms a part of the controller shown in FIG. 2.

As shown in FIG. 4, each internal fault detection sub-unit 36 obtains frequency component norm values $\Delta B_{mH}$, $\Delta B_{mL}$ of first and second frequency components, i.e. high and low frequency components $\Delta b_{mH}$, $\Delta b_{mL}$, derived from the measured voltages and currents $u_P$, $u_N$, $i_P$, $i_N$.

More specifically, the high and low frequency components $\Delta b_{mH}$, $\Delta b_{mL}$ may be frequency components of an input signal in the form of: a given measured voltage or current $u_P$, $u_N$, $i_P$, $i_N$; a positive or zero sequence component $u_{m1}$, $u_{m0}$, $i_{m1}$, $i_{m0}$ of a given measured voltage or current $u_P$, $u_N$, $i_P$, $i_N$; a given forward or backward travelling wave $f_m$, $b_m$; or a given positive and zero sequence forward or backward travelling wave $f_{m1}$, $f_{m0}$, $b_{m1}$, $b_{m0}$.

More particularly, a first of the internal fault detection sub-units 36 is configured to receive an input signal in the form of a positive sequence forward or backward travelling wave $f_{m1}$, $b_{m1}$, the measured voltage $u_P$ or current $i_P$ of the positive polar conductor or the positive sequence component $u_{m1}$, $i_{m1}$ of the measured voltage $u_P$ or current $i_P$, and a second of the internal fault detection sub-units 36 is configured to receive an input signal in the form of a zero sequence forward or backward travelling wave, the measured voltage $u_N$ or current $i_N$ of the negative polar conductor or the zero sequence component $u_{m0}$, $i_{m0}$ of the measured voltage $u_N$ or current $i_N$.

For each internal fault detection sub-unit 36, the high and low frequency components $\Delta b_{mH}$, $\Delta b_{mL}$ are obtained by passing the input signal through high and low frequency band pass filters 38,40 respectively. In an embodiment, the backward travelling wave $b_m$ is selected as the input signal, with the reference forward direction being from the DC bus to the DC power transmission medium 16.

In the embodiment shown in FIG. 4, the high frequency band pass filter 38 has a frequency band of 12-24 kHz, and the low frequency band pass filter 40 has a frequency band of 1.5-3 kHz. It will be appreciated that these frequency band values are merely selected to illustrate the working of embodiments of the invention, and other frequency band values may be used as long as the frequency band of the high frequency band pass filter 38 is higher than the frequency band of the low frequency band pass filter 40. Each band pass filter 38,40 can either be implemented by wavelet transform, as a finite impulse response (FIR) band pass filter banks, or as an infinite impulse response (IIR) band pass filter.

As an example, each band pass filter 38,40 can be designed as a zero-pole-based band pass filter in which the expression of frequency response is shown in the following equation:

$$H_{Low}(z) = \frac{(1-z^{-1})}{(1-z_1 z^{-1})(1-\bar{z}_1 z^{-1})} = \frac{1-z^{-1}}{1-a_1 z^{-1} + a_2 z^{-2}}$$

$$H_{High}(z) = \frac{(1-z^{-1})}{(1-z_2 z^{-1})(1-\bar{z}_2 z^{-1})} = \frac{1-z^{-1}}{1-b_1 z^{-1} + b_2 z^{-2}}$$

where $z_1=\exp(j\times 2pi\times f1\times Ts - \sigma 1\times Ts)$ is the pole of lower frequency f1, e.g. f1=2 kHz; $\sigma 1=500$ is the decaying factor for f1; $Z_2=\exp(j\times 2p\times f2\times Ts - \sigma 2\times Ts)$ is the pole of higher frequency f2, e.g. f2=12 kHz; $\sigma 2=250$ is the decaying factor for f2.

The algorithm for the two band pass filters 38,40 are shown as:

$$\Delta b_{mL}(n) = b_m(n) - b_m(n-1) + \alpha_1 \Delta b_{mL}(n-1) - \alpha_2 \Delta b_{mL}(n-2)$$

$$\Delta b_{mH}(n) = b_m(n) - b_m(n-1) + b_1 \Delta b_{mH}(n-1) - b_2 \Delta b_{mH}(n-2)$$

As indicated by reference numeral 43 in FIG. 4, each internal fault detection sub-unit 36 then obtains frequency component norm values $\Delta B_{mH}$, $\Delta M_{mL}$, from the high and low frequency components $\Delta b_{mH}$, $\Delta b_{mL}$. Again, each frequency component norm value $\Delta B_{mH}$, $\Delta B_{mL}$ may be a root mean square (RMS) value, an absolute mean value or another order norm value.

As an example, the RMS value $\Delta B_{mH}$, $\Delta B_{mL}$ can be obtained from a given frequency component, as follows:

$$y(n) = \sqrt{\frac{1}{W} \sum_{k=n-W+1}^{n} |x(k)|^2}$$

where x is the input signal which is the given frequency component $\Delta b_{mH}$, $\Delta b_{mL}$; y is the output signal which is the obtained RMS value $\Delta B_{mH}$, $\Delta B_{mL}$; W is again the time window length.

Subsequently each internal fault detection sub-unit 36 performs a comparison between the obtained frequency component norm values $\Delta B_{mH}$, $\Delta B_{mL}$ to determine whether the ratio of the frequency component norm value $\Delta B_{mH}$ of the high frequency component $\Delta b_{mH}$ to the frequency component norm value $\Delta B_{mL}$ of the low frequency component $\Delta b_{mL}$ exceeds a predefined threshold Rset2, i.e. whether the following discriminative condition is satisfied:

$$R_{H/L} = \frac{\Delta B_{mH}}{\Delta B_{mL}} > Rset2$$

If the ratio of the frequency component norm value $\Delta B_{mH}$ of the high frequency component bto the frequency component norm value $\Delta B_{mL}$, the low frequency component $\Delta b_{mL}$, exceeds the predefined threshold Rset2, this indicates the presence of an internal fault. Rset2 has a range [0,1] and may be set at, for example, 0.2.

If the above discriminative condition is satisfied, the corresponding internal fault detection sub-unit 36 provides a second output indication DDB_INTNL that indicates the presence of an internal fault. Each internal fault detection sub-unit 36 has a reset delay of Tdset2 that is normally set at 1 millisecond. If the above discriminative condition is not satisfied, the corresponding internal fault detection sub-unit 36 identifies the electrical fault as an external fault.

The internal fault detection unit 34 identifies the electrical fault as an internal fault if either or both of the internal fault detection sub-units 36 provides the second output indication DDB_INTNL, and thereby provides the second output indication DDB_INTNL to the trip logic block 32 of the first controller 18.

In this manner the first controller 18 is programmed to obtain frequency component norm values $\Delta B_{mH}$, $\Delta B_{mL}$ of high and low frequency components $\Delta b_{mH}$, $\Delta b_{mL}$ derived from the measured voltages and currents $u_P$, $u_N$, $i_P$, $i_N$, and then perform a comparison between the obtained frequency component norm values $\Delta B_{mH}$, $\Delta B_{mL}$ to identify the type of electrical fault.

As mentioned earlier, the first controller 18 is programmed such that the determination of the direction of the electrical fault and the determination of whether the electrical fault is an internal or external fault meet the predefined criterion when the electrical fault is identified as a forward directional fault and an internal fault. Thus, when the trip logic block 32 receives both first and second output indications DDB_FWD, DDB_INTNL, the first controller 18 operates the first protective device 14 to protect the DC power transmission medium 16 from the electrical fault.

In addition, the first controller 18 will operate the first protection device 14 upon receipt of an external signal 42 indicating the presence of an internal fault, e.g. from a second controller 118 associated with the second terminal 44 at the other end of the DC power transmission medium 16 and configured to operate a second protection device 114 in the form of a further circuit breaker. In this manner the second controller 118 and second protection device 114, along with a second measurement apparatus (not shown), together define a second DC protection scheme 110 which provides overlapping, backup protection for the DC power transmission medium 16.

The DC electrical power network shown in FIG. 1 also additionally includes another DC power transmission medium 116 which extends between the second terminal 44 and the third terminal 46.

Each terminal 20, 44, 46 electrically interconnects a corresponding first, second or third power converter 48, 50, 52 and associated first, second or third AC network 54, 56, 58 via the aforementioned DC electrical network 12, i.e. the aforementioned DC grid.

The second terminal 44 also has a third DC protection scheme 210 operatively associated therewith, with the third DC protection scheme 210 including a third controller 218, a third protection device 214 (in the form of a still further circuit breaker), and a third measurement apparatus (not shown).

In a similar manner, the third terminal 46 has a fourth DC protection scheme 310 operatively associated therewith, with the fourth DC protection scheme 310 again similarly including a fourth controller 318, a fourth protection device 314 (in the form of a yet further circuit breaker), and a fourth measurement apparatus (not shown).

The third and fourth DC protection schemes 210, 310 provide overlapping protection for the other DC power transmission medium 116.

The DC electrical power network 12 shown in FIG. 1 also further includes a further DC power transmission medium 216 which extends between the third terminal 46 and the first terminal 20.

The third terminal 46 additionally has a fifth DC protection scheme 410 operatively associated therewith (which includes a commensurate fifth controller 418, fifth protection device 414 (again a circuit breaker), and fifth measurement apparatus (not shown)), while the first terminal 20 has a sixth DC protection scheme 510 operatively associated therewith (similarly with a commensurate sixth controller 518, sixth protection device 514 (again a circuit breaker), and sixth measurement apparatus (again not shown)).

The fifth and sixth DC protection schemes 410, 510 provide overlapping protection for the further DC power transmission medium 216.

In the embodiment of the DC electrical power network 12, i.e. DC grid 14, shown in FIG. 1, each of the second, third, fourth, fifth and sixth DC protection schemes 110, 210, 310, 410, 510 is identical to the first DC protection scheme 10 described hereinabove.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A DC protection scheme for protecting a DC power transmission medium within a DC electrical power network, the DC protection scheme comprising:
   a protection device coupled in use to a DC power transmission medium, the protection device being operable to protect the DC power transmission medium from an electrical fault;
   a measurement apparatus to selectively measure at least one electrical property of the DC power transmission medium; and
   a controller programmed to:
      determine the direction of the electrical fault by comparing a locally measured forward and backward travelling waves derived from the at least one electrical property;
      determine whether the electrical fault is an internal or external fault by comparing the first and second frequency components derived from the locally measured forward and backward travelling waves derived from the at least one electrical property, wherein the frequency of the first frequency component is higher than the frequency of the second frequency component; and
      operate the protection device to protect the DC power transmission medium if the determination of the direction of the electrical fault and the determination of whether the electrical fault is an internal or external fault meet a predefined criterion.

2. The DC protection scheme according to claim 1 wherein the controller is programmed to derive each travelling wave from the at least one electrical property by combining the at least one electrical property with the surge impedance or admittance of the DC power transmission medium.

3. The DC protection scheme according to claim 1 wherein the controller is programmed to derive each travelling wave from the at least one electrical property by: converting the at least one electrical property to positive and zero sequence components; and combining the positive and zero sequence components with the positive and zero sequence surge impedances or admittances of the DC power transmission medium respectively.

4. The DC protection scheme according to claim 1 wherein the controller is programmed to obtain travelling wave norm values of the forward and backward travelling waves derived from the at least one electrical property, and the controller is programmed to perform a comparison between the obtained travelling wave norm values of the forward and backward travelling waves to determine the direction of the electrical fault.

5. The DC protection scheme according to claim 4 wherein the comparison between the obtained travelling wave norm values of the forward and backward travelling waves is performed within a duration that is twice the time it takes for each travelling wave to propagate from one end of the DC power transmission medium to the other end of the DC power transmission medium.

6. The DC protection scheme according to claim 4 wherein the controller is programmed to modify each travelling wave to remove a pre-fault component, and the controller is programmed to obtain the travelling wave norm values from the modified forward and backward travelling waves.

7. The DC protection scheme according claim 4 wherein the determination of the direction of the electrical fault meets the predefined criterion when:
   the ratio of the travelling wave norm value of the forward travelling wave to the travelling wave norm value of the backward travelling wave exceeds a predefined threshold that indicates the presence of a forward directional fault; and/or
   either of the travelling wave norm values exceeds a predefined threshold that indicates the presence of a fault.

8. The DC protection scheme according to claim 1 wherein the forward and backward travelling waves are travelling voltage waves or travelling current waves.

9. The DC protection scheme according to claim 1 wherein the controller is programmed to obtain frequency component norm values of the first and second frequency components derived from the or each measured at least one electrical property, and the controller is programmed to perform a comparison between the obtained frequency component norm values to determine whether the electrical fault is an internal or external fault.

10. The DC protection scheme according to claim 9 wherein the determination of whether the electrical fault is an internal or external fault meets the predefined criterion when the ratio of the frequency component norm value of the first frequency component to the frequency component norm value of the second frequency component exceeds a predefined threshold that indicates the presence of an internal fault.

11. The DC protection scheme according to claim 1 wherein each frequency component is:
   a frequency component of the or each measured electrical property;
   a frequency component of a sequence component converted from the or each measured property;
   a frequency component of a forward or backward travelling wave derived from the or each measured electrical property; or
   a frequency component of a positive or zero sequence forward or backward travelling wave derived from the or each measured electrical property.

12. The DC protection scheme according to claim 4 wherein each norm value is a root mean square value or an absolute mean value.

13. The DC protection scheme according to claim 1 wherein the determination of the direction of the electrical fault and the
   determination of whether the electrical fault is an internal or external fault meet the predefined criterion when the electrical fault is identified as a forward directional fault and/or an internal fault.

14. The DC protection scheme according to claim 1 wherein the controller is additionally programmed to operate the protection device to protect the DC power transmission medium upon receipt of an external signal indicating the presence of an internal fault.

15. The DC electrical power network comprising a plurality of DC protection schemes according to claim 1.

* * * * *